US008035387B2

(12) United States Patent
De Graaf et al.

(10) Patent No.: US 8,035,387 B2
(45) Date of Patent: Oct. 11, 2011

(54) METHODS AND APPARATUS FOR COMPENSATING FIELD INHOMOGENEITIES IN MAGNETIC RESONANCE STUDIES

(75) Inventors: Robin De Graaf, Hamden, CT (US); Kevin Koch, Milwaukee, WI (US)

(73) Assignee: Yale University, New Haven, CT (US)

( * ) Notice: Subject to any disclaimer, the term of this patent is extended or adjusted under 35 U.S.C. 154(b) by 273 days.

(21) Appl. No.: 12/087,616

(22) PCT Filed: Jan. 12, 2007

(86) PCT No.: PCT/US2007/000895
§ 371 (c)(1),
(2), (4) Date: Dec. 1, 2008

(87) PCT Pub. No.: WO2007/084399
PCT Pub. Date: Jul. 26, 2007

(65) Prior Publication Data
US 2009/0153139 A1    Jun. 18, 2009

Related U.S. Application Data

(60) Provisional application No. 60/759,228, filed on Jan. 13, 2006.

(51) Int. Cl.
*G01V 3/00* (2006.01)

(52) U.S. Cl. ...................... 324/320; 324/307
(58) Field of Classification Search .......... 324/300–322; 600/410–435
See application file for complete search history.

(56) References Cited

U.S. PATENT DOCUMENTS 5,635,839 A * 6/1997 Srivastava et al. ............. 324/320
6,023,167 A * 2/2000 DeMeester et al. ........... 324/318
(Continued)

FOREIGN PATENT DOCUMENTS
WO    WO 03/062847 A1    7/2003

OTHER PUBLICATIONS

Koch et al., "Adjustable Subject-Specific Passive Shims Using Optimized Distributions of Bismuth and Zirconium," *Proceedings of the International Society for Magnetic Resonance in Medicine*, 14th Scientific Meeting and Exhibition, Seattle, WA, USA, May 6, 2006, p. 519.

Koch et al, "Sample-Specific Diamagnetic and Paramagnetic Passive Shimming," *Journal of Magnetic Resonance*, vol. 182, Jun. 30, 2006, pp. 66-74.

(Continued)

*Primary Examiner* — Dixomara Vargas
(74) *Attorney, Agent, or Firm* — Wolf, Greenfield & Sacks, P.C.

(57) ABSTRACT

One aspect of the present disclosure relates to a method or determining location(s) at which at least one magnetic article is to be positioned during a magnetic resonance imaging procedure of at least one subject. A magnetic field Bo is applied to a region that includes the at least one subject and does not include the at least one magnetic article. First magnetic resonance information about the region in response to the applied magnetic field BO is received. The first magnetic resonance information relates at least in part to one or more magnetic field inhomogeneities in the region. Based at least in part on the first magnetic resonance information, at least one first location proximate the at least one subject at which at least one paramagnetic article and/or diamagnetic article is to be positioned is determined, so as to at least partially compensate for the one or more magnetic field inhomogeneities.

7 Claims, 6 Drawing Sheets

U.S. PATENT DOCUMENTS

| | | | | |
|---|---|---|---|---|
| 6,294,972 B1 * | 9/2001 | Jesmanowicz et al. | ....... | 335/301 |
| 6,819,108 B2 * | 11/2004 | Huang et al. | .......... | 324/320 |
| 6,836,119 B2 * | 12/2004 | DeMeester et al. | ........... | 324/320 |
| 7,414,401 B1 * | 8/2008 | Lvovsky | ............ | 324/318 |
| 7,459,908 B2 * | 12/2008 | Juchem | ............ | 324/320 |
| 7,570,141 B2 * | 8/2009 | Hollis et al. | ............ | 335/216 |
| 7,589,531 B2 * | 9/2009 | Yamashita et al. | ........... | 324/318 |
| 2003/0109783 A1 | 6/2003 | Heid | | |
| 2004/0183636 A1 | 9/2004 | Chapman | | |
| 2008/0164878 A1 * | 7/2008 | Morich et al. | ............ | 324/320 |

OTHER PUBLICATIONS

Schenck et al., "The Role of Magnetic Susceptibility in Magnetic Resonance Imaging: MRI Magnetic Compatibility of the First and Second Kinds," *Medical Physics*, AIP, Melville, NY, US, vol. 23, No. 6, Jun. 1, 1996, pp. 815-850.

Chauvel et al., "Cancellation of Metal-Induced MRI Artifacts with Dual-Component Paramagnetic and Diamagnetic Material: Mathematical Modelization and Experimental Verification," *Journal of Magnetic Resonance Imaging*, vol. 6, 1996, pp. 936-938.

\* cited by examiner

METHODS AND APPARATUS FOR COMPENSATING FIELD INHOMOGENEITIES IN MAGNETIC RESONANCE STUDIES

GOVERNMENT SPONSORED RESEARCH

This invention was made with U.S. Government support under NIH Grants R21 CA118503 and R01 EB002097. The U.S. Government has certain rights to this invention.

RELATED APPLICATIONS

This application is a National Stage Application under 35 U.S.C. §371 of PCT Application PCT/US2007/000895 which claims the benefit of U.S. Provisional Application 60/759,228.

BACKGROUND

1. Technical Field

The concepts described herein relate generally to reducing magnetic field inhomogeneities for magnetic resonance imaging.

2. Discussion of Related Art

Magnetic resonance imaging (MRI) is a technique used frequently in medical and research applications to produce images of the inside of subjects such as humans and animals. MRI is based on detecting nuclear magnetic resonance (NMR) signals, which are electromagnetic waves emitted by atomic nuclei in response to excitation by an electromagnetic field. In particular, magnetic resonance (MR) techniques involve detecting NMR signals produced upon the re-alignment of the nuclear spins of atoms in the subject's tissue.

During an MRI procedure, NMR signals emitted from a volume of interest or from a slice (i.e., a relatively thin region) of the volume of interest are detected. The detected NMR signals may then be utilized to produce a two-dimensional (2D) image of the slice. A 2D image of a slice is composed of pixels, each pixel having an intensity (e.g., a magnitude or value) that is proportional to the strength of the NMR signal emitted by a corresponding location in the volume of interest. A plurality of such 2D images reconstructed from NMR signal data obtained from successive slices may be stacked together to form a three-dimensional (3D) image. A 3D image is composed of voxels, each voxel having an intensity proportional to the strength of the NMR signal emitted from a corresponding portion of the volume of interest.

To obtain NMR signals, a static magnetic field $B_0$ is applied to a region of interest, and nuclei within the region are excited by applying RF electromagnetic radiation at the Larmor frequency. The Larmor frequency is the frequency at which nuclear spins process about the axis of the static magnetic field $B_0$, and is proportional to the strength of the static magnetic field $B_0$. When applied, the RF electromagnetic radiation at the Larmor frequency causes the nuclear spins to change orientation, such that the spins are no longer aligned with the static magnetic field $B_0$. The nuclear spins then gradually re-realign with the static magnetic field $B_0$, releasing electromagnetic energy at the Larmor frequency that is detectable as NMR signals. Accordingly, the NMR signals contain information that is significantly dependent on the static magnetic field $B_0$. The NMR signals may be detected using one or more RF coils sensitive to electromagnetic changes caused by the NMR signals.

Inhomogeneities in the applied magnetic field $B_0$ may arise in various subjects, such as animals and humans, and may be caused by boundaries, such as tissue-air boundaries which cause disruptions in the magnetic field $B_0$. Since the Larmor frequency is proportional to the magnetic field $B_0$, inhomogeneities in the magnetic field $B_0$ may cause the Larmor frequency to be shifted in some areas. Thus, the RF electromagnetic radiation emitted from these areas may be shifted from the expected Larmor frequency, and this electromagnetic radiation may not be detected as well as electromagnetic radiation emitted at the expected Larmor frequency. The NMR signals that are detected as a result of such field inhomogeneities may lead to undesirable artifacts in images constructed from such NMR signals.

Conventional techniques for homogenizing the magnetic field $B_0$ include using active or passive compensation components commonly referred to in the relevant arts as "shims." One example of an active shim is an electromagnetic coil placed in the static magnetic field $B_0$. The electromagnetic coil may have a controllable current that induces changes in the magnetic field around the coil. However, active shims may be limited to providing relatively coarse, low-order magnetic field corrections. A passive shim is a piece of magnetic material placed in the static magnetic field $B_0$ that alters the field around the shim. However, image artifacts may remain in spite of these conventional techniques, as they are only partially effective in reducing the magnetic field $B_0$ inhomogeneities.

SUMMARY

One aspect of the present disclosure relates to a method of determining location(s) at which at least one magnetic article is to be positioned during a magnetic resonance imaging procedure of at least one subject. A magnetic field $B_0$ is applied to a region that includes the at least one subject and does not include the at least one magnetic article. First magnetic resonance information about the region in response to the applied magnetic field $B_0$ is received. The first magnetic resonance information relates at least in part to one or more magnetic field inhomogeneities in the region. Based at least in part on the first magnetic resonance information, at least one first location proximate the at least one subject at which at least one paramagnetic article and/or diamagnetic article is to be positioned is determined, so as to at least partially compensate for the one or more magnetic field inhomogeneities. In exemplary implementations, the at least one subject may include all or only a portion of a human or one or more animals.

Another aspect of the present disclosure relates to a method of determining locations at which at least two magnetic articles are to be positioned during a magnetic resonance imaging procedure of at least one rodent. A magnetic field $B_0$ is applied to a region that includes the at least one rodent and does not include the at least two articles. First magnetic resonance information about the region in response to the applied magnetic field $B_0$ is received. The first magnetic resonance information relates at least in part to one or more magnetic field inhomogeneities in the region. Based at least in part on the first magnetic resonance information, at least one first location proximate the at least one rodent at which at least one paramagnetic article is to be positioned is determined, so as to at least partially compensate for the one or more magnetic field inhomogeneities. Additionally, based at least in part on the first magnetic resonance information, at least one second location proximate the at least one rodent at which at least one diamagnetic article is to be positioned is determined, so as to at least partially compensate for the one or more magnetic field inhomogeneities.

Yet another aspect of the present disclosure relates to a magnetic resonance imaging system. The magnetic resonance imaging system includes a magnetic field generator to generate a magnetic field in a region that includes at least one rodent, and at least one support member to support the at least one rodent in the region in which the magnetic field is generated. The magnetic resonance imaging system also includes at least one paramagnetic article and at least one diamagnetic article positioned on the at least one support member and proximate to the at least one rodent so as to reduce one or more inhomogeneities of the magnetic field in the region and proximate to or within the at least one rodent.

Yet another aspect of the present disclosure relates to a method of determining locations at which at least two magnetic articles are to be positioned during a magnetic resonance imaging procedure of at least one subject. A magnetic field $B_0$ is applied to a region that includes the at least one subject and does, not include the at least two articles. First magnetic resonance information about the region in response to the applied magnetic field $B_0$ is received. The first magnetic resonance information relates at least in part to one or more magnetic field inhomogeneities in the region. Based at least in part on the first magnetic resonance information, at least one first location proximate the at least one subject at which at least one paramagnetic article is to be positioned is determined, so as to at least partially compensate for the one or more magnetic field inhomogeneities. Additionally, based at least in part on the first magnetic resonance information, at least one second location proximate the at least one subject at which at least one diamagnetic article is to be positioned is determined, so as to at least partially compensate for the one or more magnetic field inhomogeneities.

A further aspect of the present disclosure relates to a magnetic resonance imaging system. The magnetic resonance imaging system includes a magnetic field generator to generate a magnetic field in a region that includes at least one subject, and at least one support member to support the at least one subject in the region in which the magnetic field is generated. The magnetic resonance imaging system also includes at least one paramagnetic article and at least one diamagnetic article positioned on the at least one support member and proximate to the at least one subject so as to reduce one or more inhomogeneities of the magnetic field in the region and proximate to or within the at least one subject.

The present application incorporates by reference U.S. Provisional Application Ser. No. 60/759,228, entitled "PROTOCOL TO DETERMINE AN OPTIMUM SUBJECT-SPECIFIC DISTRIBUTION OF MATERIALS FOR STATIC FIELD HOMOGENEITY IN MAGNETIC RESONANCE STUDIES," filed on Jan. 13, 2006.

It should be appreciated that all combinations of the foregoing concepts and additional concepts discussed in greater detail below are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Figures 1A, 1B, 1C:
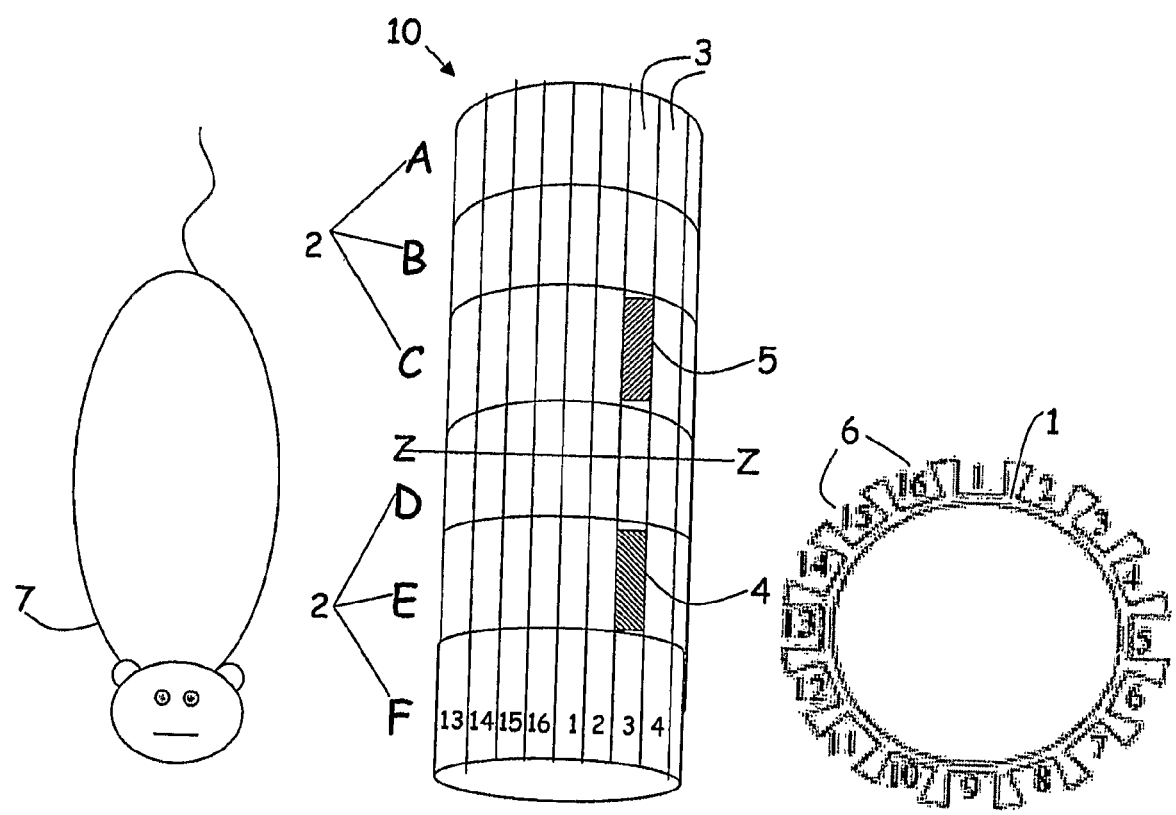
FIGS. 1A-1C illustrate a subject on which magnetic resonance imaging is desired to be performed and a magnetic resonance imaging apparatus, according to one embodiment of the present disclosure.

Applicants have recognized and appreciated that the conventional techniques discussed above for compensating inhomogeneities in a magnetic field $B_0$ employed for magnetic resonance studies such as MRI may not provide sufficiently fine corrections in magnetic field magnitude. As a consequence, magnetic resonance images taken (or other data acquired) using these prior techniques may still have undesired image artifacts or errors due to the magnetic field inhomogeneities.

In view of the foregoing, various embodiments of the present disclosure are directed to methods and apparatus for improved compensation of magnetic field inhomogeneities, particularly for MRI applications and other magnetic resonance studies.

In some embodiments, a more homogeneous magnetic field is achieved by placing at least one paramagnetic article and/or at least one diamagnetic article in the proximity of a region to be imaged (or from which magnetic resonance information is desired). In general, a paramagnetic article may add to the nearby magnetic field, and a diamagnetic article may subtract from the nearby magnetic field. Any suitable number of diamagnetic and/or paramagnetic articles may be used to correct magnetic field inhomogeneities, as discussed in further detail below. Furthermore, a large variety of different configurations (e.g., relative positions) of paramagnetic and diamagnetic articles placed in proximity to a region to be imaged are possible, and an appropriate configuration of such articles may be determined according to various methods described herein, to reduce the magnetic field inhomogeneities and thereby improve the quality of images obtained via an MRI procedure.

For example, in some embodiments, the position of a plurality of paramagnetic and/or diamagnetic articles during a magnetic resonance imaging procedure may be chosen using a magnetic article determination algorithm. The magnetic article determination algorithm may select parameters for the type, placement, and/or number of articles to be used during the magnetic resonance imaging procedure. In some embodiments, the magnetic article determination algorithm may select these parameters based on a first "evaluation" MRI procedure of the region without the plurality of articles, so as to assess the nature of magnetic field inhomogeneities present. Once such an evaluation MRI is acquired, the article determination algorithm may determine how to reduce the magnetic field inhomogeneities by specifying the type, placement and/or number of articles to be placed in proximity to the region of interest. Then, the plurality of articles may be placed in the specified position(s) proximate to the region and an MRI procedure may be performed on the region with the plurality of articles in place, and the magnetic field inhomogeneities reduced.

By way of example, in one embodiment, a researcher may wish to perform an MRI procedure to image a mouse brain as part of a research study. However, the brain tissue geometry in the mouse may cause inhomogeneities in the magnetic field $B_0$. To reduce the inhomogeneities, one or more diamagnetic and paramagnetic articles may be placed in appropriate positions near the mouse brain such that the magnetic field $B_0$ inhomogeneities are effectively reduced. However, it should be appreciated that the techniques described herein may be used for imaging any suitable subject, such as mice, other types of rodents such as rats or guinea pigs, and/or other types of mammals, such as humans. The techniques described herein may have a variety of applications such as performing animal research studies and/or performing medical evaluation of humans. Furthermore, although the present disclosure describes reducing magnetic field inhomogeneity introduced by subjects, the concepts disclosed herein can be used to reduce inhomogeneity from any source, such as from the magnetic field B0 source, magnetic resonance imaging system surroundings, etc.

FIG. 1A schematically illustrates a mouse 7 to undergo an MRI procedure. As discussed above, the mouse's tissue geometry may cause magnetic field $B_0$ inhomogeneities. FIGS. 1B-1C are diagrams illustrating top and cross-sectional views, respectively, of an example of an imaging apparatus 10, according to one embodiment of the present disclosure, that may be used to facilitate and improve magnetic resonance imaging of the mouse 7 shown in FIG. 1A. Imaging apparatus 10 includes a support member 1, inside of which mouse 7 may be placed during an MRI procedure. The support member is configured so as to facilitate placement of one or more paramagnetic article(s) 4 and/or one or more diamagnetic article(s) 5 (examples of which are discussed below) in proximity to the mouse 7 when the mouse is inside of the support member. In this manner, the support member 1 provides mechanical support for paramagnetic article(s) 4 and diamagnetic article(s) 5 during a magnetic resonance imaging procedure of the mouse.

More specifically, as illustrated in FIG. 1B, support member 1 includes a plurality of positions 3 at which one or more magnetic articles (such as paramagnetic article(s) 4 and/or diamagnetic article(s) 5) may be placed. In one exemplary implementation, support member 1 may have a plurality of axial sections A-F, as illustrated in FIG. 1B, and a plurality of angular sections 1-16, as illustrated in FIG. 1C (FIG. 1C is a diagram illustrating a cross section of support member 1 along the line Z-Z illustrated in FIG. 1B). The plurality of axial sections and angular sections may form a grid-like pattern (hereinafter referred to simply as a "grid"), and one or more magnetic article(s) may be placed in any one of positions 3 on the grid.

By way of example, one paramagnetic article 4 is shown in FIG. 1B at position E3, and one diamagnetic article 5 is shown at position C3. However, it should be appreciated that any suitable configuration, number, and size of positions may be used for placement of magnetic articles, and the present disclosure is not limited to the particular grid illustrated in FIG. 1B.

Furthermore, although support member 1 is illustrated in FIGS. 1B and 1C as having a substantially cylindrical shape, it should be appreciated that any suitable shape for imaging a particular subject may be chosen according to other implementations pursuant to the concepts disclosed herein. In some embodiments, the size and shape of support member 1 may be chosen such that the paramagnetic and/or diamagnetic article(s) may be positioned as close to the subject (e.g., mouse 7) as possible, as the magnetic induction field induced by a magnetic article generally decreases in strength with a greater distance from the article. In one exemplary implementation, the paramagnetic and/or diamagnetic article(s) may be positioned within approximately two centimeters of the surface of the subject, and in another implementation they may be positioned within approximately five millimeters of the subject. However, any suitable distance between the subject and the magnetic articles may be used, as long as the subject and the magnetic articles are in an effective proximity of one another (e.g., close enough that the field induced by a given magnetic article remains strong enough to reduce some magnetic field inhomogeneity in the subject).

A given paramagnetic article (e.g., paramagnetic article(s) 4) and a given diamagnetic article (e.g., diamagnetic article(s) 5) contemplated by the present disclosure may be formed of any suitable material or combination of materials. As one example, a paramagnetic article may be formed of zirconium (Zr), which has a magnetic susceptibility $X_s$ of approximately $70 \times 10^{-6}$. As another example, a paramagnetic article may be formed of niobium (Nb), which has a magnetic susceptibility $X_s$ of approximately $225 \times 10^{-6}$. Examples of diamagnetic materials which may be used include bismuth (Bi), which has a magnetic susceptibility $X_s$ of approximately $-160 \times 10^{-6}$, and crystalline graphite, which has a magnetic susceptibility $X_s$ of from approximately $-200 \times 10^{-6}$ to $-400 \times 10^{-6}$. However, it should be appreciated that any suitable magnetic materials may be used. In some embodiments, magnetic materials may be chosen that exhibit particularly strong diamagnetic or paramagnetic properties, which may reduce the amount of the material needed to induce a strong enough field to correct for inhomogeneities. In some implementations, materials that do not exhibit ferromagnetic properties may be preferable for articles employed to compensate magnetic field inhomogeneities; ferromagnetic materials may be subjected to a mechanical force when placed in a strong magnetic field (such as commonly employed in MRI scanners), which may cause an undesired change in the position of the magnetic article.

Figure 2:
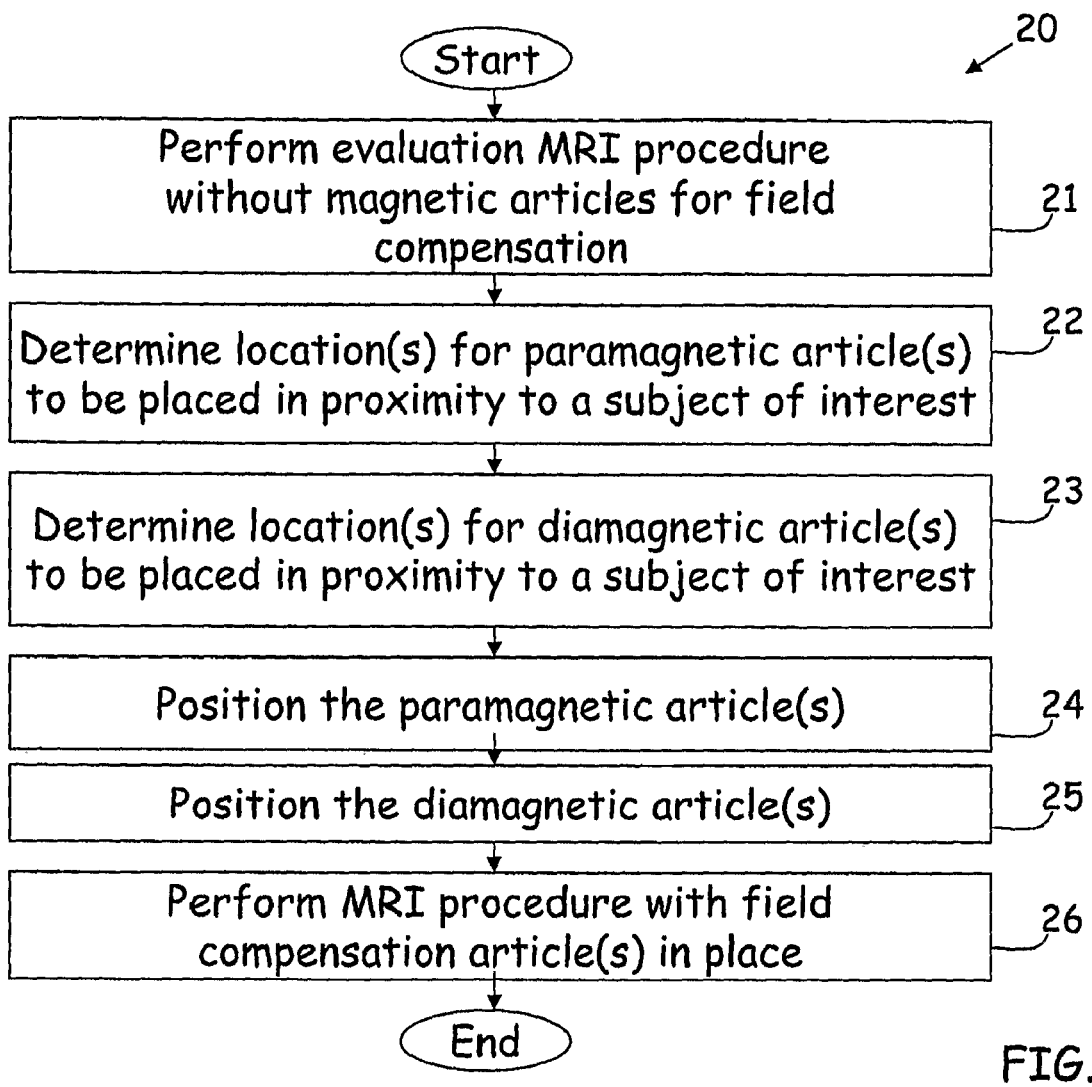
FIG. 2 illustrates a method of imaging a subject using MRI, according to one embodiment of the present disclosure.

FIG. 2 is a flow chart illustrating a method 20 of performing an MRI procedure, according to one embodiment of the present disclosure.

In step 21, magnetic resonance information for a region of interest (e.g., the head of the mouse 7) is acquired without any magnetic articles for compensation of field inhomogeneities. For example, mouse 7 may be placed in the support member 1, without any paramagnetic or diamagnetic articles placed in the support member, and a first "evaluation" MRI procedure may be performed to obtain information about the magnetic field (and/or magnetic flux density) distribution in the region of interest (e.g., information about the distribution of the magnetic field in the region of mouse 7 may be obtained). For example, a measured magnetic field F(r) for each spatial position r in the region, as a result of applying the static magnetic field $B_0$, may be determined using a gradient-echo mapping technique, as known in the relevant art. The measured magnetic field (and/or magnetic flux density) information obtained from the evaluation MRI procedure the is provided to an article determination algorithm that uses this information to determine magnetic article parameters(s) such as placement, number and/or type of magnetic articles that should be placed on the support member proximate the subject so as to reduce magnetic field $B_0$ inhomogeneities. One exemplary article determination algorithm according to the present disclosure is discussed below in connection with FIG. 3.

As indicated in FIG. 2, in step 22, via an article determination algorithm a location may be determined for which at least one paramagnetic article may be positioned during an MRI procedure to provide magnetic field compensation. For example, with reference again to FIG. 1B, it may be determined in step 22 that paramagnetic article 4 should be placed at position E3, as illustrated in FIG. 1B of the support member 1. If a plurality of paramagnetic articles should be used, a plurality of locations at which the paramagnetic articles should be positioned during a magnetic resonance imaging procedure may be determined in step 22. As discussed below in connection with FIG. 3, in one exemplary implementation one or more magnetic article "maps" may be generated indicating the locations at which the paramagnetic articles should be positioned (e.g., on support member 1), one example of which is discussed below and illustrated in FIG. 4.

In step 23 of FIG. 2, a location similarly may be determined for which at least one diamagnetic article may be positioned during an MRI procedure to provide magnetic field compensation. For example, it may be determined in step 23 that diamagnetic article 5 should be placed at position C3, as illustrated in FIG. 1B. If a plurality of diamagnetic articles should be used, a plurality of locations at which the diamagnetic articles should be positioned during a magnetic resonance imaging procedure may be determined in step 23. As discussed above regarding paramagnetic article(s), one or more magnetic article maps may be generated showing the locations at which the diamagnetic article(s) should be positioned (e.g., on support member 1). In some implementations, steps 22 and 23 may be performed together, and a single magnetic article map may be generated showing the locations at which both the paramagnetic and diamagnetic article(s) should be positioned.

The determined locations may be provided to a human operator or to a machine so that the magnetic articles may be placed, either manually or automatically, at positions proximate the subject that correspond to the determined locations. The placement of the paramagnetic and/or diamagnetic article(s) may be performed in steps 24 and 25, as indicated in FIG. 2. For example, the determined locations (e.g., one or more magnetic article map(s)) may be displayed for the operator (e.g., on a monitor, printed page, etc.), and the operator may place the magnetic articles in the appropriate positions proximate the subject (the operator may affix the magnetic articles to support member 1 in position(s) that correspond to the determined location(s) that will be in the proximity of the subject). It should be appreciated that steps 24 and 25 may be performed in any suitable order, and may be performed together in some embodiments.

In step 26 of FIG. 2, an MRI procedure may be performed on the subject (or a particular region of interest of the subject) with the magnetic articles in the positions proximate the subject that correspond to their determined locations on the support member to correct for magnetic field inhomogeneities. For example, the subject (e.g., mouse 7) may be placed in a magnetic resonance imaging scanner, with a support member 1 and magnetic articles placed in their determined positions with respect to the subject. Accordingly, an MRI procedure may be performed with a more homogeneous magnetic field.

Figure 3:
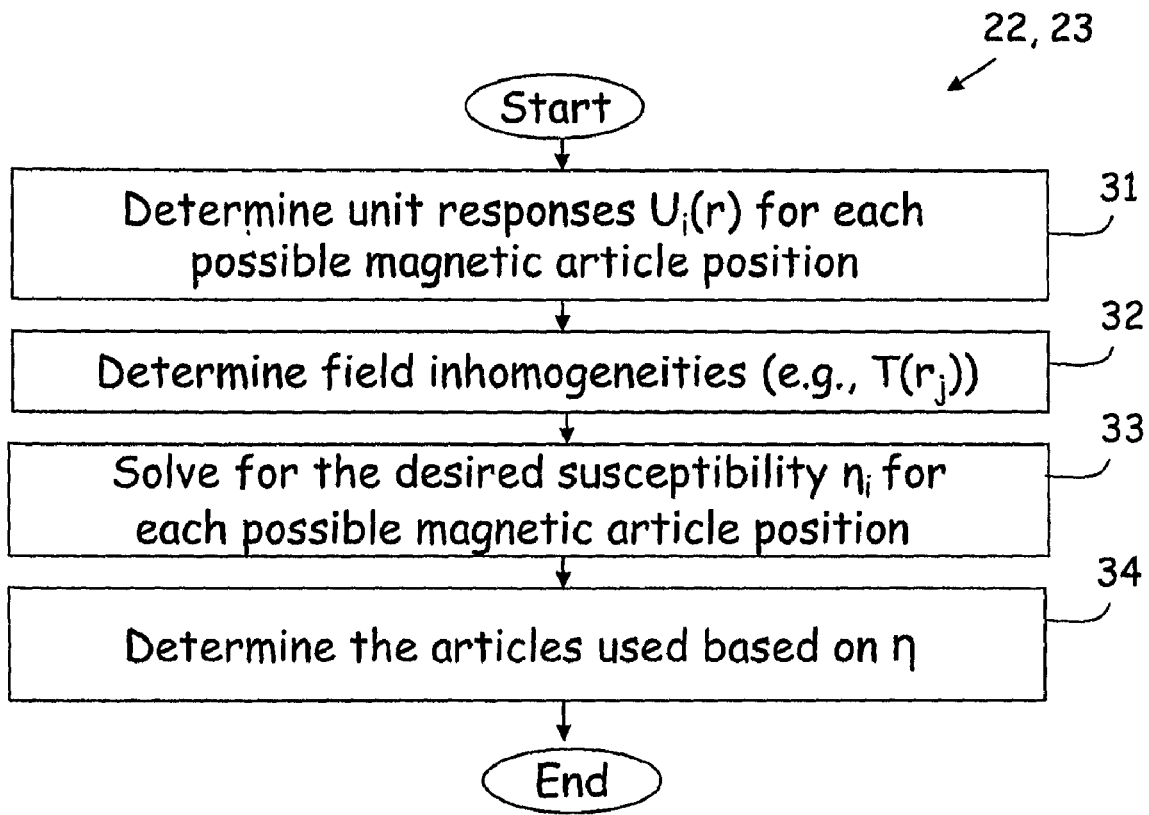
FIG. 3 illustrates a method of determining one or more locations at which magnetic article(s) are to be positioned during a magnetic resonance imaging procedure, according to one embodiment of the present disclosure.

FIG. 3 illustrates one exemplary magnetic article determination algorithm according to the present disclosure for implementing one or both of the steps 22 and 23 shown in FIG. 2. By way of example, the support member grid illustrated in FIGS. 1B and 1C has N=96 (e.g., 6×16) possible positions at which one or more magnetic articles may be placed. However, it should be appreciated that a support member according to various embodiments of the present disclosure may be configured as a grid having virtually any number N of possible magnetic article positions. In one aspect, greater number of possible magnetic article positions N may increase the spatial resolution with which magnetic field corrections may be achieved. In another aspect, a lesser number of possible magnetic article positions N may increase the speed of the magnetic article determination algorithm, and decrease the amount of time needed to place magnetic articles at the determined positions. Accordingly, an appropriate value for N may be chosen based on these and/or other criteria.

Within a region of interest (e.g., within mouse 7), one may define M volume elements (e.g., voxels), each having a value that represents the corresponding magnetic field strength at a position in the region corresponding to the voxel. It should be appreciated that any suitable number of volume elements M may be used, and M may be chosen depending on the resolution of an MRI scanner used, the size of the subject, and/or any other suitable criteria.

In step 31 of FIG. 3, a "unit response" $U_i(r_j)$ may be determined for each possible magnetic article position i on the support member 1 grid (e.g., position(s) 3). The unit response $U_i(r_j)$ is the component of the magnetic induction field that results at a position $r_j$ within the subject (simplified to a vector of voxels $r_j$ representing the positions within the subject) in response to placing a magnetic article of unity susceptibility ($X_s$=1) at position i on the grid. By determining the unit response for each possible magnetic article position, the total response for a plurality of magnetic articles (at a plurality of magnetic article positions) may be calculated by adding appropriately scaled individual unit responses from each position. The term "response" refers to the magnetic field (and/or flux density) change that would result at positions $r_j$ of the region of interest by adding a particular magnetic article at a particular position i on the grid. As discussed below, the magnetic article determination algorithm according to one embodiment may determine the type and number of magnetic articles to be placed at each position by optimizing the scaling $\eta_i$ of the unit response $U_i(r_j)$ at for each possible magnetic article position such that the magnetic field inhomogeneities are minimized.

Each unit response $U_i(r_{j=1, 2, \ldots, M})$ corresponding to a particular grid position i on the support member 1 is a vector having values that represent the magnetic field (an/or magnetic flux density) strength for a plurality of positions $r_j$ (where j=1, 2, … M) within a region of interest that would result from a magnetic article having a susceptibility of $X_s$=1 being placed at position i the grid. Thus, U(r) is a matrix of size N×M that represents the unit response for each possible magnetic article position (from i=1, 2, … N) that results at each point (j=1, 2, … M) within the region of interest. The unit responses may be found either empirically, by performing an MRI for a magnetic article placed at each position, by calculation, or by simulating the magnetic field that would result from the placement of an article at such a position, etc. The unit responses may be found prior to performing step(s) 22 and/or 23 of FIG. 2, and may be stored for use (e.g., on a computer readable medium) in step(s) 22 and/or 23 of FIG. 2. During step 31 of FIG. 3 the unit responses may be determined by the magnetic article determination algorithm by accessing the stored unit responses.

In step 32 of FIG. 3, magnetic field (and/or magnetic flux density) information about a region of interest (e.g., mouse 7), without field compensation may be used to assess the presence of field inhomogeneities. For example, the measured magnetic field $F(r_j)$ within the region of interest, determined in step 21 of FIG. 2, may be compared to the nominal magnetic field value $B_0$ (e.g., the nominal magnetic field value B may be subtracted from the measured magnetic field $F(r)$ to obtain the unwanted magnetic field inhomogeneity $T(r)$ (e.g., $T(r)=F(r)-B_0$), which is a vector of M elements (for each position j within the region of interest).

In step 33 of FIG. 3, the inhomogeneous magnetic field may be determined. As one example, the matrix equation $T=-U\eta$ may be solved for the variable $\eta$. Any suitable technique may be used to solve such a matrix equation, as would be readily recognized by one of ordinary skill in the art. For example, the matrix U may be inverted to obtain $U^{-1}$, and the inverse may be multiplied by $-T$ to solve for the vector $\eta$ The variable $\eta$ is a vector of variables $\eta_i$ that each represent the desired susceptibility for a magnetic article that should be placed at each position i on the grid.

This matrix calculation is a simplified calculation (based on assumptions discussed below) that may be derived from a least-squares minimization of the field inhomogeneities. As discussed above, $T(r)$ represents the magnetic field inhomogeneities caused by the subject. Magnetic articles(s) placed in the proximity of the subject will generate an induction field $A(r_j)$. The induction field within the region is then given by the superposition of the magnetic field induced by any paramagnetic or diamagnetic articles at respective positions on the grid, given by $$A(r) = \sum_{i=1}^{N} \eta_i U_i(r),$$

where as discussed above, $\eta_i$ is the desired magnetic susceptibility determined for each position on the grid of support member 1 and $U_i(r)$ is the induction field unit response for a magnetic article of unity susceptibility ($X_s=1$) at a given position on the grid. If one can create an induction field $A(r)$ that cancels the unwanted magnetic field inhomogeneity $T(r)$, then the magnetic field inhomogeneity is eliminated. One approach is to minimize the squared error, which may be expressed as the following:

$$\text{Minimize} \sum_{j=1}^{M} \left[ T(r_j) + \sum_{i=1}^{N} \eta_i U_i(r_j) \right]^2$$

The solutions $\eta_i$ now represent optimal response scaling coefficients which may reduce and/or minimize the magnetic field inhomogeneity. This problem can be farther simplified to the linear problem $T=-U\eta$, as discussed above. It should be appreciated that the unit response (for $X_s=1$) is given as one example for the unit response, but that any unit response value could be chosen, and the scaling factors $\eta$ should be adjusted accordingly if the unit response is calculated based on a magnetic article of different susceptibility.

In some embodiments, one or more approximations may be made to simplify the calculations performed by the magnetic article determination algorithm discussed above in connection with FIG. 3 so that the minimization problem may be reduced to a linear problem. The following three approximations may be used:

(1) In positions not directly adjacent to a magnetic article, the magnetic induction fields from a magnetic article (or stacks of magnetic articles) at separate grid positions add in linear superposition.

(2) The amplitude and shape of a magnetic induction field from a magnetic article is dominated by its own susceptibility and is trivially perturbed by other nearby materials with much smaller magnetic susceptibilities (such as tissue). This approximation may be typically encountered in vivo.

(3) The geometric distribution of an article's induction field does not change substantially when more than one magnetic article stacked at a same grid position (in a limited fashion).

These approximations have been shown to closely approximate the full magnetostatic field solutions, while saving significant computation time. In some embodiments, using one or more of these approximations enables determining the appropriate magnetic article positions within a matter of seconds. However, it should be appreciated that this exemplary algorithm is provided merely by way of illustration, and that any suitable algorithm may be used.

Once $\eta$ has been obtained, the actual magnetic articles that should be placed at each position may be determined. Although each susceptibility value $\eta_i$ may be a continuous quantity, it may be desirable to use a limited set of materials (e.g., one diamagnetic material and one paramagnetic material) to achieve the determined susceptibility value or an approximation thereto.

In step 34 of FIG. 3, the number and type of paramagnetic and/or diamagnetic articles that should be placed at the positions i on the grid may be determined based on the desired susceptibility values $\eta_i$ for each position having a nonzero (or approximately nonzero) value $\eta_i$. Given predetermined material types and a predetermined number of magnetic articles that may be placed at a single position i, the combination of magnetic elements that most closely approximates the desired susceptibility value $\eta_i$. For example, if the desired susceptibility value $\eta_i$ for a position is $-320\times10^{-6}$, and the materials used are bismuth ($X=-160\times10^{-6}$) and zirconium ($X=70\times10^{-6}$), then two bismuth elements may be placed at the position $\eta_i$ (e.g., $2\times-1 \ 60\times10^{-6}$). As another example, if the desired susceptibility value $\eta_i$ for a position is $-80\times10^{-6}$, then one bismuth and one zirconium element may be placed at this position to achieve a value of $-90\times10^{-6}$, which may be relatively close to the desired susceptibility. Thus, the determined susceptibility value may be approximated by stacking paramagnetic and/or diamagnetic articles of pre-determined material types.

Figure 4:
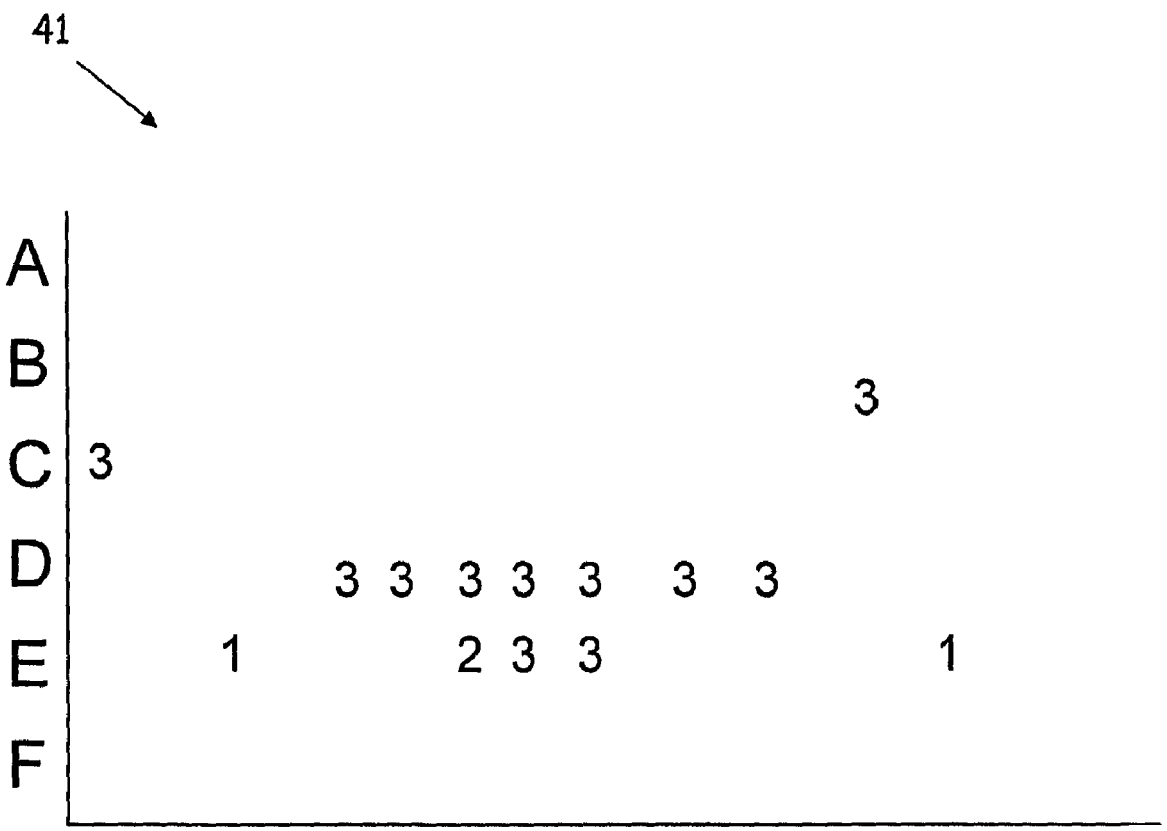
FIG. 4 shows a map illustrating the positions at which magnetic articles are to be placed and the number of magnetic articles to be placed at each position for a magnetic resonance imaging procedure according to one embodiment of the present disclosure.

Once the determination is made as to the locations of where the diamagnetic and paramagnetic articles should be placed, these locations may be used for positioning the magnetic articles. As one example, the locations may be displayed for an operator who may then place the articles into their determined positions. FIG. 4 illustrate an example of diamagnetic article map 41 showing the determined locations for a plurality of diamagnetic articles (e.g., made of bismuth). The locations illustrated in FIG. 4 correspond to the positions illustrated in FIGS. 1B and 1C. Diamagnetic article map 41 has numbers on the map that indicate the number of diamagnetic articles determined to be placed at each position (positions having zero elements are shown as blank). In this example, a single location may include from 0-3 diamagnetic articles. However, it should be appreciated that the determined locations may be presented in any other suitable way, such as using a different type of visual representation. Similarly, a paramagnetic article map may be generated that shows the determined locations for the paramagnetic article(s). In some embodiments, both diamagnetic and paramagnetic article locations may be shown on the same map.

Figure 5A:
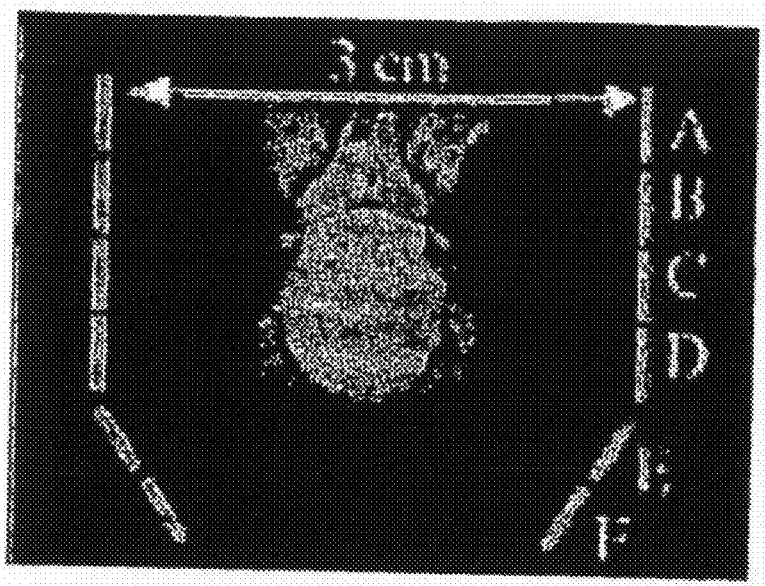
FIGS. 5A and 5B illustrate a magnetic resonance image of a subject and a photograph of the subject, respectively, according to some embodiments of the present disclosure.

FIG. 5A is an example of an image of a mouse (e.g., mouse 7) acquired pursuant to an MRI procedure according to one embodiment of the present disclosure. In this embodiment, the magnetic field inhomogeneities have been reduced, and an image of improved quality is obtained. This embodiment also illustrates that support member 1 may have a tapered cylindrical shape, which may help position magnetic articles close to the subject (e.g., near a mouse's head).

Figure 5B:
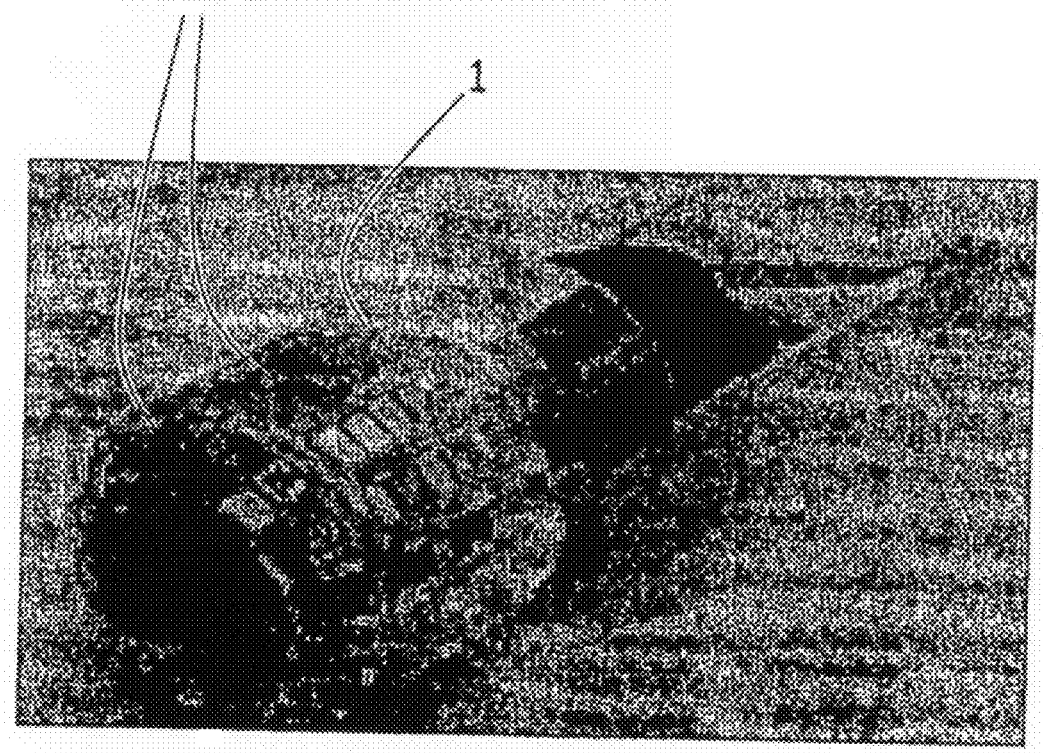

FIG. 5B is a photograph illustrating a mouse (e.g., mouse 7) positioned within support member 1, in preparation for imaging. As illustrated in FIG. 5B, support member 1 has a plurality of magnetic articles 4 and 5 affixed thereto for correcting magnetic field inhomogeneities.

In some embodiments, a plurality of subjects may be imaged together within a magnetic resonance imaging system. Performing imaging on multiple subjects at a time may reduce the amount of time needed to conduct a research study. For example, a plurality of rodents may be placed in a magnetic resonance imaging system, with each rodent supported by its own support member having paramagnetic and/or diamagnetic articles placed thereon.

If multiple subjects are imaged (either together or separately), each rodent may have it's own specific magnetic article configuration, determined in accordance with the techniques described above. Alternatively, some or all rodents may be provided the same magnetic article configuration, and not determined on a subject-specific basis. For example, one "large rodent" magnetic article configuration may be determined for large mice, and "small rodent" magnetic article configuration may be determined for small mice. A researcher may be provided with a kit having a "small rodent module" that includes a support member sized for small rodents that is preconfigured with paramagnetic and/or diamagnetic article(s) in a pre-set generic "small rodent" configuration. Similar modules may be provided in the kit for rodents that may be used for imaging mice of other sizes. In some implementations, a kit may be provided having modules that are configured to fit different sizes of humans (e.g., for imaging the human head).

Figure 6:
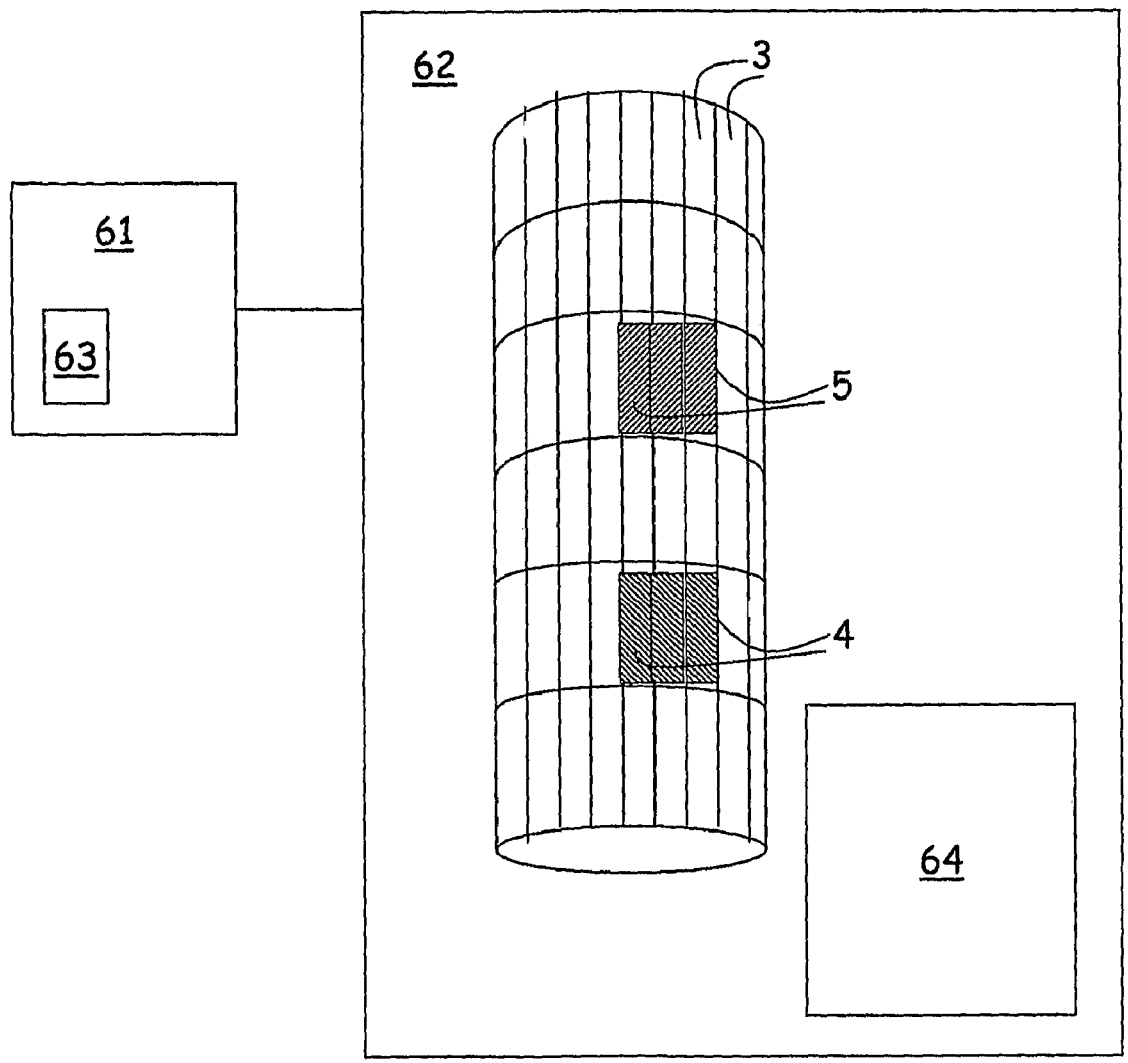
FIG. 6 illustrates an imaging and computing environment in which embodiments of the present disclosure may be implemented.

FIG. 6 illustrates an imaging and computing system 60 on which embodiments of the present disclosure may be implemented. System 60 includes a computer 61 that may be coupled to a magnetic resonance imaging system 62. Magnetic resonance imaging system 62 may include magnetic field generator 64 that generates the magnetic field $B_0$. Magnetic resonance imaging system 62 may perform a first MRI procedure on a subject (e.g., mouse 7) to determine information about the magnetic field $B_0$, such as the magnetic field $B_0$ distribution in the region of the subject (e.g., without the magnetic articles in place for field compensation). The information about the magnetic field $B_0$ may be provided to computer 61 and/or any other suitable device that determines the locations at which the magnetic articles should be placed to correct for the magnetic field $B_0$ inhomogeneities.

In some embodiments, a magnetic article determination algorithm (e.g., as discussed above in connection with FIG. 3) may be implemented on computer 61. Computer 61 may receive magnetic resonance information about the magnetic field $B_0$ from magnetic resonance imaging system 62, and the determination algorithm may use the magnetic resonance information to determine the locations at which magnetic articles should be positioned. However, it should be appreciated that any suitable device or combination of devices may determine the locations, as the techniques described herein are not limited to being performed by any particular hardware or software. Computer readable instructions for performing the methods described herein may be stored on a computer readable medium 63 in any suitable form. Any type of computer readable media may be used, such as volatile or non-volatile memory, a magnetic disk, an optical disk such as a CD-ROM, etc.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of determining locations at which at least two magnetic articles are to be positioned during a magnetic resonance imaging procedure of at least one subject, the method comprising:

A) using a magnetic resonance imaging system, applying a magnetic field $B_0$ to a region that includes the at least one subject and does not include the at least two magnetic articles;

B) receiving first magnetic resonance information about the region in response to the applied magnetic field $B_0$, the first magnetic resonance information relating at least in part to one or more magnetic field inhomogeneities in the region;

C) determining, based at least in part on the first magnetic resonance information, at least one first location proximate the at least one subject at which at least one paramagnetic article is to be positioned so as to at least partially compensate for the one or more magnetic field inhomogeneities;

D) determining, based at least in part on the first magnetic resonance information, at least one second location proximate the at least one subject at which at least one diamagnetic article is to be positioned so as to at least partially compensate for the one or more magnetic field inhomogeneities;

E) prior to steps C) and D), determining a plurality of magnetic induction fields U induced in the region by a plurality of reference magnetic articles each having a reference magnetic susceptibility, the plurality of reference magnetic articles being placed at a plurality of different positions N proximate to the at least one subject, wherein the steps C) and D) are performed based at least in part on the first magnetic resonance information and the plurality of magnetic induction fields U;

F) determining inhomogeneous magnetic field information T by comparing the static magnetic field $B_0$ and the first magnetic resonance information; and G) determining, for the plurality of different positions N proximate to the at least one subject, a plurality of scaling values η which, when respectively multiplied by the reference magnetic susceptibility, represent a plurality of actual magnetic susceptibilities at the plurality of different positions N that facilitate compensation of the one or more magnetic field inhomogeneities, wherein i is a first index, j is a second index, M is a number of positions r within the region, and determining the plurality of scaling values comprises finding η that minimizes $$\sum_{j=1}^{M}\left[T(r_j)+\sum_{i=1}^{N}\eta_i U_i(r_j)\right]^2.$$

2. The method of claim 1, wherein determining the plurality of scaling values η comprises solving a matrix equation T=Uη for η.

3. The method of claim 1, further comprising determining, for each of the plurality of different positions N corresponding to a non-zero value for η, an integer number of diamagnetic and/or paramagnetic elements that equals or most closely approximates a corresponding one of the plurality of actual magnetic susceptibilities.

4. The method of claim 3, wherein the first location determined in the step C) is a first position of the N positions corresponding to a first non-zero value for η, and the second location determined in the step D) is a second position of the N positions corresponding to a second non-zero value for η.

5. The method of claim 1, wherein the at least one subject comprises a rodent.

6. The method of claim 1, wherein the at least one subject comprises a plurality of rodents.

7. The method of claim 1, further comprising:
placing the at least one paramagnetic article in the at least one first location;
placing the at least one diamagnetic article in the at least one second location; and
performing magnetic resonance imaging of the at least one subject with the at least one paramagnetic article in the at least one first location and the at least one diamagnetic article in the at least one second location.

\* \* \* \* \*